United States Patent
Lee et al.

(10) Patent No.: US 12,080,586 B2
(45) Date of Patent: *Sep. 3, 2024

(54) SUBSTRATE TRANSFER ROBOT FOR TRANSFERRING SUBSTRATE IN VACUUM CHAMBER

(71) Applicant: T-Robotics Co., Ltd., Osan-si (KR)

(72) Inventors: Soo Jong Lee, Suwon-si (KR); Myung Jin Kim, Pyeontaek-si (KR); Chang Seong Lee, Hwaseong-si (KR); Seung Young Baek, Osan-si (KR); Chang Hyun Jee, Anyang-si (KR); Sang Hwi Ham, Gunpo-si (KR); Moon Gi Hur, Suwon-si (KR); Jae Hyun Park, Osan-si (KR); Tae Han Lee, Yangju-si (KR)

(73) Assignee: T-Robotics Co., Ltd., Osan-si (KR)

( * ) Notice: Subject to any disclaimer, the term of this patent is extended or adjusted under 35 U.S.C. 154(b) by 358 days.

This patent is subject to a terminal disclaimer.

(21) Appl. No.: 17/723,154

(22) Filed: Apr. 18, 2022

(65) Prior Publication Data
US 2022/0384240 A1   Dec. 1, 2022

(30) Foreign Application Priority Data

May 31, 2021   (KR) ......................... 10-2021-0070274

(51) Int. Cl.
*H01L 21/687*   (2006.01)
(52) U.S. Cl.
CPC .............................. *H01L 21/68707* (2013.01)

(58) Field of Classification Search
CPC ........................... B25J 9/043; H01L 21/68707
See application file for complete search history.

(56) References Cited

U.S. PATENT DOCUMENTS

RE43,781 E  * 11/2012  Yoshino ........................ D15/199
8,366,375 B2 * 2/2013  Musha .................... F16J 15/324
                                                                414/744.5

(Continued)

FOREIGN PATENT DOCUMENTS

JP          11300659 A  * 11/1999
JP       2000195923 A  *  7/2000

(Continued)

*Primary Examiner* — Gerald McClain
(74) *Attorney, Agent, or Firm* — David R. Stevens; Stevens Law Group

(57) ABSTRACT

A substrate transfer robot for transferring a substrate in a vacuum chamber, includes: a transfer arm platform having coupling holes, each compartmentalized into a lower and an upper space, wherein a link connecting member with blades is engaged at a front area of the transfer arm platform and a support shaft of a lower support is inserted into the lower space of one of the coupling holes; and a first and a second transfer arm part each including an end effector for supporting the substrate, multiple transfer link arms and subordinate link arms, and a common link arm that are connected to each other or to the transfer arm platform, wherein, for each transfer arm part, drive shafts, interlocked with transfer driving motors or speed reducers installed on one of the transfer link arms, and output shafts interlocked with the drive shafts are installed on the transfer link arms.

7 Claims, 7 Drawing Sheets

(56) References Cited

U.S. PATENT DOCUMENTS

| | | | |
|---|---|---|---|
| 10,695,903 B2* | 6/2020 | Hashimoto | B25J 9/042 |
| 2014/0099180 A1* | 4/2014 | Ando | B25J 11/0095 |
| | | | 414/744.4 |
| 2022/0380145 A1* | 12/2022 | Lee | B61B 13/10 |
| 2022/0410413 A1* | 12/2022 | Lee | B25J 9/043 |
| 2022/0410944 A1* | 12/2022 | Lee | B61B 13/00 |
| 2023/0133347 A1* | 5/2023 | Oh | H01L 21/67742 |
| | | | 414/751.1 |
| 2023/0260821 A1* | 8/2023 | Lee | H01L 21/67742 |
| | | | 414/751.1 |
| 2023/0260822 A1* | 8/2023 | Lee | H01L 21/67196 |
| | | | 414/226.05 |

FOREIGN PATENT DOCUMENTS

| | | | | |
|---|---|---|---|---|
| JP | 2005032942 A | * | 2/2005 | B25J 18/04 |
| JP | 2011101912 A | * | 5/2011 | B25J 9/042 |
| JP | 2012101292 A | * | 5/2012 | B25J 11/00 |
| JP | 2012186389 A | * | 9/2012 | |
| KR | 1382145 B1 | * | 4/2014 | B25J 11/0095 |

* cited by examiner

SUBSTRATE TRANSFER ROBOT FOR TRANSFERRING SUBSTRATE IN VACUUM CHAMBER

CROSS REFERENCE OF RELATED APPLICATION

This present application claims the benefit of the earlier filing date of Korean non-provisional patent application No. 10-2021-0070274, filed May 31, 2021, the entire contents of which being incorporated herein by reference.

FIELD OF THE DISCLOSURE

The present disclosure relates to a substrate transfer robot; and more particularly, to the substrate transfer robot for transferring substrates in a vacuum chamber that is located within a substrate processing equipment.

BACKGROUND OF THE DISCLOSURE

In general, a substrate such as a wafer for a semiconductor device, a glass substrate for a display device, or a glass substrate for a thin film solar cell is manufactured by performing various processes on the substrate. During these processes, the substrate is loaded and processed in a substrate processing equipment that provides optimal conditions for each of the processes.

Nowadays, in order to improve productivity, a cluster-type substrate processing equipment capable of collectively processing the substrate is being developed and used.

The cluster-type substrate processing equipment includes a load lock chamber for storing the substrate, a transfer chamber for transferring the substrate, and a plurality of process chambers for performing each manufacturing process.

Additionally, a substrate transfer robot, installed in the transfer chamber that is in a vacuum state, may transfer the substrate back and forth between the transfer chamber and the load lock chamber, among multiple transfer chambers, or in and out of the process chambers.

Recently, in order to cope with a large size and a heavy weight of the substrate and to improve a substrate processing capability, various researches on high-rigidity substrate transfer robots are in progress.

Also, there is a need for operating a more compact substrate transfer robot in a state capable of maintaining a high vacuum condition in order to improve an efficiency of an installation area of a manufacturing equipment.

In response, various structures of substrate transfer robot suitable for meeting these needs are being proposed, such as constructing arms of the substrate transfer robot into link structures, sealing an inside of each of the arms forming the link structure, and installing a driving motor and a speed reducer on the inside of each arm.

However, for the conventional substrate transfer robot having the above-mentioned structures, an arm platform to which link arms are coupled is formed as a sealed structure, wherein the driving motor is installed inside the sealed structure, while the speed reducer required for a rotational movement of the link arms is installed in each inside of the link arms.

As a result, the conventional substrate transfer robot requires the arm platform to be large enough to have the driving motor installed therein.

Further, the conventional substrate transfer robot has difficulties in installation, repair and maintenance since the driving motor needs to be installed in the arm platform while the speed reducer is installed in each of the link arms.

In other words, when problems arise in operating the substrate transfer robot, the repair and the maintenance of the substrate transfer robot may take a long time since the arm platform and each of the link arms are required to be dissembled one by one to check any failures of the driving motor and the speed reducer.

PRIOR ART LITERATURE (Patent Document 0001) Korean Patent Publication No. 10-2011-0052454 A

SUMMARY OF THE DISCLOSURE

It is an object of the present disclosure to solve all the aforementioned problems.

It is another object of the present disclosure to provide a substrate transfer robot that can fundamentally block any generation of particles in a vacuum chamber.

It is still another object of the present disclosure to provide the substrate transfer robot having a compact structure suitable for saving on an installation area.

It is still yet another object of the present disclosure to provide the substrate transfer robot having a sealed vacuum structure within the vacuum chamber.

In accordance with one aspect of the present disclosure, there is provided a substrate transfer robot for transferring a substrate in a vacuum chamber, comprising: a transfer arm platform through which a first coupling hole, a second coupling hole and a third coupling hole are formed respectively at a first center area, a first one-end area and a first opposite-end area thereof, wherein a first locking member, through which a first through-hole corresponding to a hollow of a support shaft formed on a transfer robot coupling part of a lower support, compartmentalizes the first coupling hole into a first upper space sealed by a first cover and a first lower space, wherein a second locking member, through which a second through-hole is formed, compartmentalizes the second coupling hole into a second upper space and a second lower space sealed by a second cover, wherein a third locking member, through which a third through-hole is formed, compartmentalizes the third coupling hole into a third upper space and a third lower space sealed by a third cover, wherein a link connecting member including a first blade and a second blade for link connection is fixedly engaged at a front area, with a direction of the front area being a direction of a processing chamber from the substrate transfer robot when the substrate transfer robot is positioned to transfer the substrate to the processing chamber coupled with the vacuum chamber, and wherein the support shaft at the lower support inserted into the first lower space is fixedly engaged with the first locking member; a first transfer arm part including a (1_1)-st transfer link arm, a (1_2)-nd transfer link arm, a first common link arm, a (1_1)-st subordinate link arm parallel to the (1_1)-st transfer link arm, a (1_2)-nd subordinate link arm parallel to the (1_2)-nd transfer link arm, a (1_3)-rd subordinate link arm parallel to the first common link arm, and a first end effector, wherein a first transfer driving motor and a first speed reducer, interlocked with the first transfer driving motor to reduce a rotational speed of the first transfer driving motor by half, are installed in a sealed inner space of the (1_1)-st transfer link arm, wherein a (1_1)-st drive shaft, having a hollow formed therein and interlocked with the first speed reducer, and a (1_1)-st output shaft interlocked with the (1_1)-st drive shaft are sealingly installed on a (1_1)-st one-end area of the (1_1)-st transfer link arm, wherein a (1_2)-nd drive shaft, having a hollow formed therein and interlocked with the first transfer driving motor, and a (1_2)-nd output shaft interlocked with the (1_2)-nd drive shaft are sealingly installed on a (1_1)-st opposite-end area of the (1_1)-st transfer link arm, wherein the (1_1)-st output shaft of the (1_1)-st transfer link arm is fixedly engaged with a first linking member that is inserted into the second upper space of the transfer arm platform to be fixedly engaged with the second locking member, wherein a (1_2)-nd one-end area of the (1_2)-nd transfer link arm is fixedly engaged with the (1-2)-nd output shaft of the (1_1)-st transfer link arm through a first fixed coupling shaft, wherein a second center area of the first common link arm is rotatably engaged with the first fixed coupling shaft, wherein a (1_4)-th one-end area of the (1_1)-st subordinate link arm is rotatably engaged with the first blade of the link connecting member of the transfer arm platform, and a (1_4)-th opposite-end area of the (1_1)-st subordinate link arm is rotatably engaged with a (1_3)-rd one-end area of the first common link arm, wherein a (1_5)-th one-end area of the (1_2)-nd subordinate link arm is rotatably engaged with a (1_3)-rd opposite-end area of the first common link arm, wherein a (1_6)-th one-end area of the (1_3)-rd subordinate link arm is rotatably engaged with a (1_5)-th opposite-end area of the (1_2)-nd subordinate link arm, (1_6)-th opposite-end area of the (1_3)-rd subordinate link arm is rotatably engaged with a (1_2)-nd opposite-end area of the (1_2)-nd transfer link arm, and wherein the first end effector is fixed to the (1_6)-th opposite-end area of the (1_3)-rd subordinate link arm to thereby support the substrate; and a second transfer arm part including a (2_1)-st transfer link arm, a (2_2)-nd transfer link arm, a second common link arm, a (2_1)-st subordinate link arm parallel to the (2_1)-st transfer link arm, a (2_2)-nd subordinate link arm parallel to the (2_2)-nd transfer link arm, a (2_3)-rd subordinate link arm parallel to the second common link arm, and a second end effector, wherein a second transfer driving motor and a second speed reducer, interlocked with the second transfer driving motor to reduce a rotational speed of the second transfer driving motor by half, are installed in a sealed inner space of the (2_1)-st transfer link arm, wherein a (2_1)-st drive shaft, having a hollow formed therein and interlocked with the second speed reducer, and a (2_1)-st output shaft interlocked with the (2_1)-st drive shaft are sealingly installed on a (2_1)-st one-end area of the (2_1)-st transfer link arm, wherein a (2_2)-nd drive shaft, having a hollow formed therein and interlocked with the second transfer driving motor, and a (2_2)-nd output shaft interlocked with the (2_2)-nd drive shaft are sealingly installed on a (2_1)-st opposite-end area of the (2_1)-st transfer link arm, wherein the (2_1)-st output shaft of the (2_1)-st transfer link arm is fixedly engaged with a second linking member that is inserted into the third upper space of the transfer arm platform to be fixedly engaged with the third locking member, wherein a (2_2)-nd one-end area of the (2_2)-nd transfer link arm is fixedly engaged with the (2-2)-nd output shaft of the (2_1)-st transfer link arm through a second fixed coupling shaft, wherein a third center area of the second common link arm is rotatably engaged with the second fixed coupling shaft, wherein a (2_4)-th one-end area of the (2_1)-st subordinate link arm is rotatably engaged with the second blade of the link connecting member of the transfer arm platform, and a (2_4)-th opposite-end area of the (2_1)-st subordinate link arm is rotatably engaged with a (2_3)-rd one-end area of the second common link arm, wherein a (2_5)-th one-end area of the (2_2)-nd subordinate link arm is rotatably engaged with a (2_3)-rd opposite-end area of the second common link arm, wherein a (2_6)-th one-end area of the (2_3)-rd subordinate link arm is rotatably engaged with a (2_5)-th opposite-end area of the (2_2)-nd subordinate link arm, and a (2_6)-th opposite-end area of the (2_3)-rd subordinate link arm is rotatably engaged with a (2_2)-nd opposite-end area of the (2_2)-nd transfer link arm, and wherein the second end effector is fixed to the (2_6)-th opposite-end area of the (2_3)-rd subordinate link arm to thereby support the substrate.

As one example, the (1_1)-st opposite-end area of the (1_1)-st transfer link arm of the first transfer arm part is located at the front area of the transfer arm platform, and the (2_1)-st opposite-end area of the (2_1)-st transfer link arm of the second transfer arm part is located at a rear area of the transfer arm platform.

As another example, a height of the second fixed coupling shaft is set as higher than a height of the first fixed coupling shaft such that the first end effector and the second end effector are positioned at different heights during operations of the first end effector and the second end effector.

As another example, the second common link arm includes a hollow tube corresponding to a height of the second fixed coupling shaft and having a hollow formed therein for inserting the second fixed coupling shaft therein, wherein a third blade including the (2_3)-rd one-end area is fixedly coupled with a lower area of the hollow tube and a fourth blade including the (2_3)-rd opposite-end area is fixedly coupled with an upper area of the hollow tube, and wherein the (2_3)-rd one-end area and the (2_3)-rd opposite-end area with respect to a central axis of the hollow tube are lying symmetrically on each side of the central axis of the hollow tube when viewed from the central axis of the hollow tube.

As another example, the transfer arm platform further includes: a first wiring hole bridging the first upper space and the second lower space; and a second wiring hole bridging the first upper space and the third lower space.

As another example, the transfer arm platform further includes: a (1_1)-st wiring hole and a (1_2)-nd wiring hole, each bridging the first upper space and one side of a body of the transfer arm platform; a (2_1)-st wiring hole, bridging the second lower space and the one side of the body of the transfer arm platform; a (2_2)-nd wiring hole, bridging the third lower space and the one side of the body of the transfer arm platform; a first sealing cover, sealing the (1_1)-st wiring hole and the (2_1)-st wiring hole at the one side of the body of the transfer arm platform; and a second sealing cover, sealing the (1_2)-nd wiring hole and the (2_2)-nd wiring hole at the one side of the body of the transfer arm platform.

As another example, the substrate transfer robot further includes: a first wiring for an operation of the first transfer driving motor; and a second wiring for an operation of the second transfer driving motor, wherein the first wiring is fed into the first transfer driving motor through the hollow of the support shaft and the hollow of the (1_1)-st drive shaft so as to prevent the first wiring from being exposed to an inner space of the vacuum chamber, and wherein the second wiring is fed into the second transfer driving motor through the hollow of the support shaft and the hollow of the (2_1)-st drive shaft so as to prevent the second wiring from being exposed to the inner space of the vacuum chamber.

BRIEF DESCRIPTION OF THE DRAWINGS

The accompanying drawings used to explain example embodiments of the present disclosure are only part of example embodiments of the present disclosure and other drawings can be obtained based on the drawings by those skilled in the art of the present disclosure without inventive work.

DETAILED DESCRIPTION OF THE PREFERRED EMBODIMENTS

Figure 1:
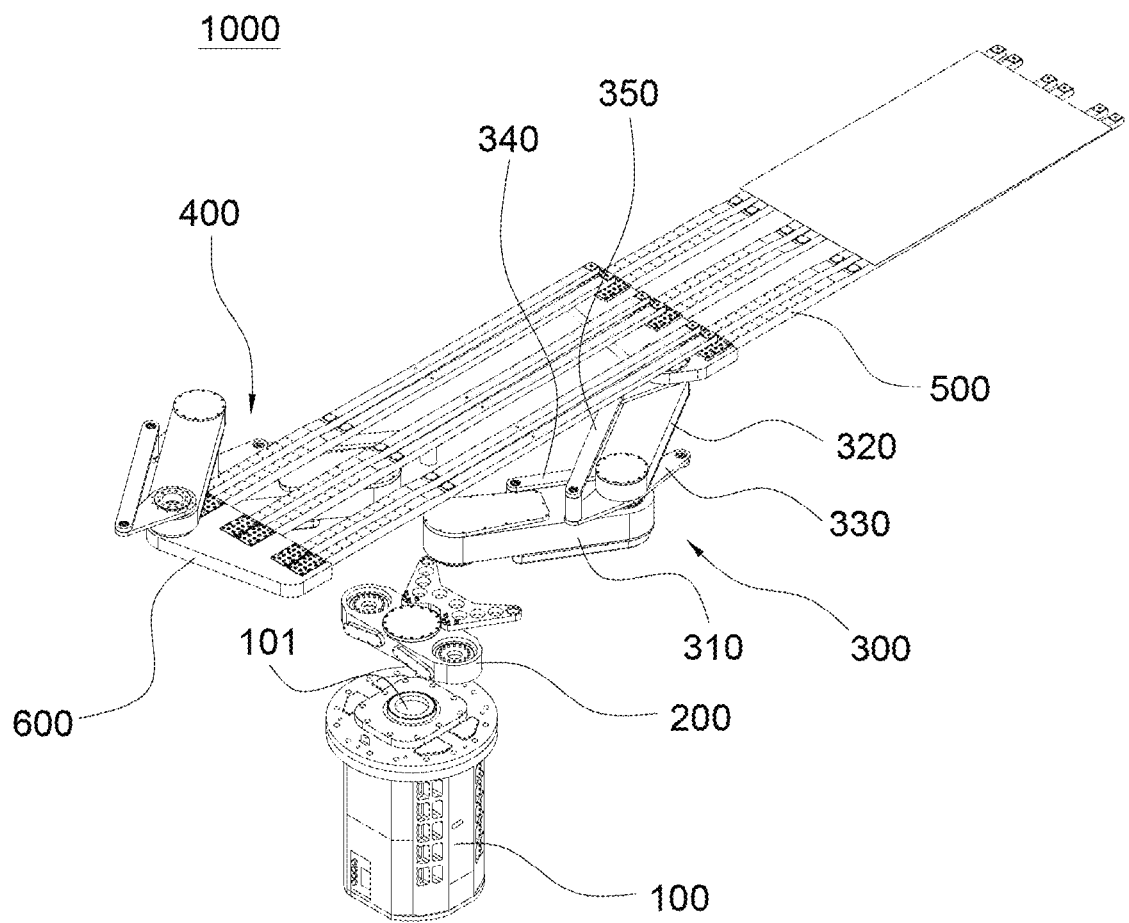
FIG. 1 and FIG. 2 are drawings schematically illustrating a substrate transfer robot in accordance with one example embodiment of the present disclosure.

The following detailed description of the present disclosure refers to the accompanying drawings, which show by way of illustration a specific embodiment in which the present disclosure may be practiced, in order to clarify the objects, technical solutions and advantages of the present disclosure. These embodiments are described in sufficient detail to enable those skilled in the art to practice the present disclosure.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the present disclosure, although different, are not necessarily mutually exclusive. For example, a particular feature, structure, or characteristic described herein in connection with one embodiment may be implemented within other embodiments without departing from the spirit and scope of the present disclosure. In addition, it is to be understood that the position or arrangement of individual elements within each disclosed embodiment may be modified without departing from the spirit and scope of the present disclosure. The following detailed description is, therefore, not to be taken in a limiting sense, and the scope of the present disclosure is defined only by the appended claims, appropriately interpreted, along with the full range of equivalents to which the claims are entitled. In the drawings, like numerals refer to the same or similar functionality throughout the several views.

To allow those skilled in the art to carry out the present disclosure easily, the example embodiments of the present disclosure will be explained by referring to attached diagrams in detail as shown below.

Figure 2:
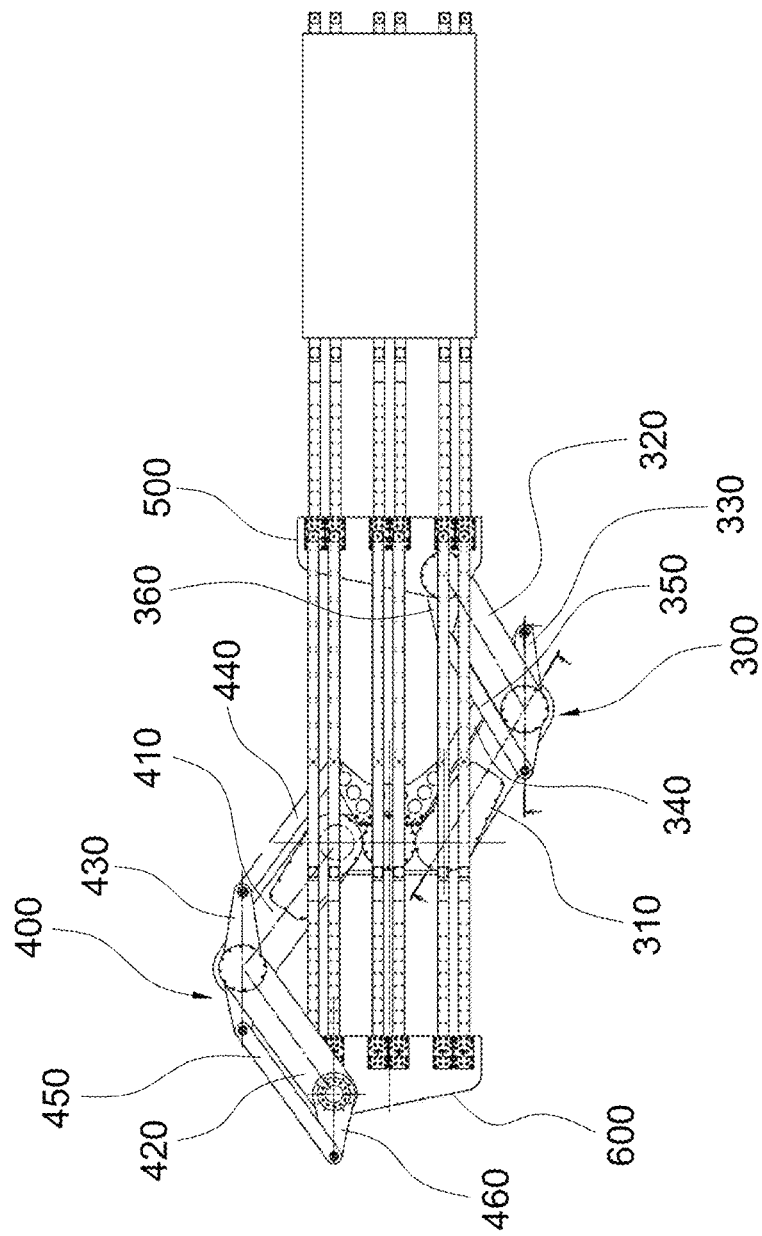

FIG. 1 and FIG. 2 are drawings schematically illustrating a substrate transfer robot in accordance with one example embodiment of the present disclosure.

Hereinafter, expressions "coupled with" and "engaged with" are used interchangeably to explain configurations where two components are combined, or combined to be moved together, within the travel robot, between the travel robot and the substrate transfer robot, or within the substrate transfer robot, according to corresponding explanations where the respective expressions are used.

By referring to FIG. 1 and FIG. 2, the substrate transfer robot 1000 may include a transfer arm platform 200 engaged with a support shaft 101 formed on a transfer robot coupling part of a lower support 100, and may include a first transfer arm and a second transfer arm part 400 that are engaged with the transfer arm platform 200. Herein, the first transfer arm part 300 and the second transfer arm part 400 may be respectively engaged with a first end effector 500 and a second end effector 600 for supporting a substrate.

Through this, in a state where the first end effector 500 or the second end effector 600 is positioned at a loading position of the substrate or an unloading position of the substrate by a vertical movement of the lower support 100 of the substrate transfer robot 1000 at a set location within a vacuum chamber, the first end effector 500 or the second end effector 600 may load or unload the substrate by operations of the first transfer arm part 300 or the second transfer arm part 400.

Herein, the lower support 100 may include an elevating part that enables a vertical movement and a rotational movement of the substrate transfer robot 1000, and a vertical position of the substrate transfer robot 1000 may be adjusted by an operation of the elevating part so that the substrate transfer robot 1000 is positioned at an appropriate height for loading or unloading the substrate onto or from a process chamber and the like.

In addition, as the case may be, the lower support 100 may further include a travel robot that is coupled with an upper region of the elevating part, and the travel robot may move the substrate transfer robot 1000 supported thereon in a set direction. Herein, the travel robot may seal a hollow formed in an elevating drive shaft of the elevating part from its inside, and an inner line formed by the hollow of the elevating drive shaft may be connected to the support shaft that supports the substrate transfer robot 1000.

First, the transfer arm platform 200 may be connected with the lower support 100.

Figure 3A:
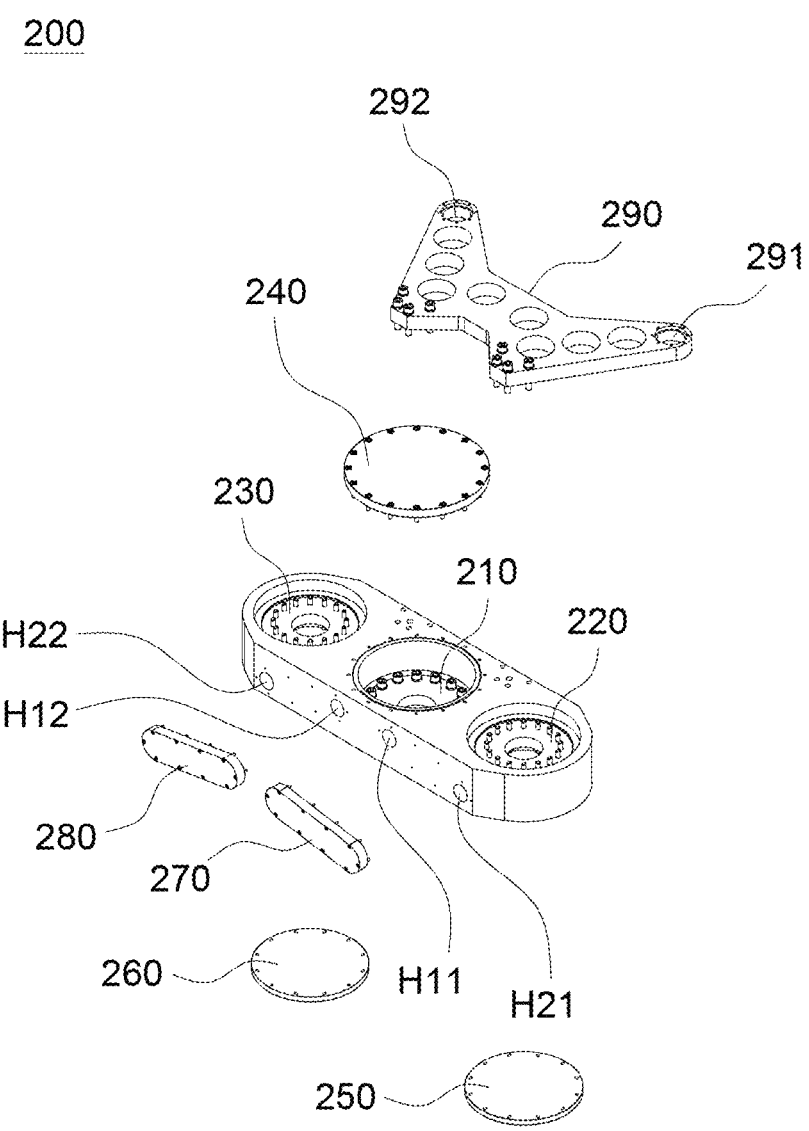
FIG. 3A to FIG. 3C are drawings schematically illustrating a transfer arm platform of the substrate transfer robot in accordance with one example embodiment of the present disclosure.
Figure 3B:
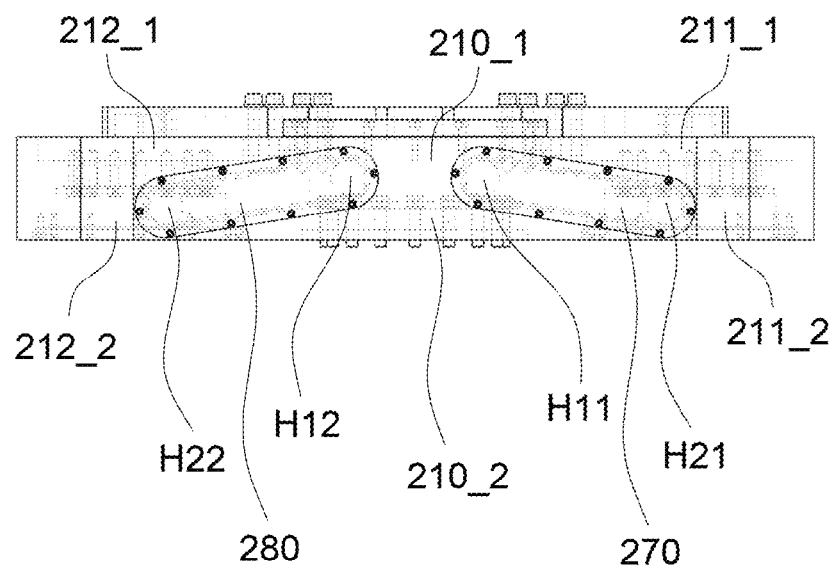

Herein, by referring to FIG. 3A and FIG. 3B, the transfer arm platform 200 may include a first coupling hole 210 formed at a first center area, a second coupling hole 220 formed at a first one-end area, and a third coupling hole 230 formed at a first opposite-end area.

The first coupling hole 210 at the first center area may be compartmentalized into a first upper space 210_1 and a first lower space 210_2 by a first locking member 210_3 that has a first through-hole corresponding to a hollow of the support shaft 101 of the lower support 100, and the first upper space 210_1 may be sealed by a first cover 240.

In addition, the second coupling hole 220 at the first one-end area may be compartmentalized into a second upper space 211_1 and a second lower space 211_2 by a second locking member 211_3 that has a second through-hole, and the second lower space 211_2 is sealed by a second cover 250.

Further, the third coupling hole 230 at the first opposite-end area may be compartmentalized into a third upper space 212_1 and a third lower space 212_2 by a third locking member 212_3 that has a third through-hole, and the third lower space 212_2 may be sealed by a third cover 260.

Also, the transfer arm platform 200 may have a link connecting member 290 including a first blade 291 and a second blade 292 for link connection that is fixedly engaged at its front area. Herein, a direction of the front area may be a direction of a processing chamber from the substrate transfer robot 1000 when the substrate transfer robot 1000 is positioned to transfer the substrate to the processing chamber coupled with the vacuum chamber.

Also, the transfer arm platform 200 may be engaged with the lower support 100, and more specifically, the support shaft 101 of the lower support 100 may be inserted into the first lower space 210_2 of the first coupling hole 210 so that the support shaft 101 is fixedly engaged with the first locking member 210_3. Herein, when the support shaft 101 is fixedly engaged with the first locking member 210_3, sealing at a coupling area between the support shaft 101 and the first locking member 210_3 may be improved by adding sealing members such as an O-ring, a gasket, etc. Since the configuration of adding the sealing members, such as the O-ring, the gasket, etc., may be similarly applied to other coupling parts to be described hereinafter, a description thereof is omitted in the following description of the present disclosure.

Through this, exposure to an external environment through the hollow of the support shaft 101 may be sealed away, at the first coupling hole 210, from a vacuum environment of an inside of the vacuum chamber.

Meanwhile, wiring holes for introducing wirings that are inserted through the hollow of the support shaft 101 of the lower support 100 into the first transfer arm part 300 and the second transfer arm part 400 may be formed on the transfer arm platform 200.

That is, a (1_1)-st wiring hole H11 and a (1_2)-nd wiring hole H12, each bridging the first upper space 210_1 and one side of a body of the transfer arm platform 200 may be formed. Also, a (2_1)-st wiring hole H21, bridging the second lower space 211_2 and the one side of the body of the transfer arm platform 200, and a (2_2)-nd wiring hole H22, bridging the third lower space 212_2 and the one side of the body of the transfer arm platform 200, may be formed.

In addition, for sealing the wiring holes, a first sealing cover 270 that seals the (1_1)-st wiring hole H11 and the (2_1)-st wiring hole H21 at the one side of the body of the transfer arm platform 200 and a second sealing cover 280 that seals the (1_2)-nd wiring hole H12 and the (2_2)-nd wiring hole H22 at the one side of the body of the transfer arm platform 200 may be provided.

Figure 3C:
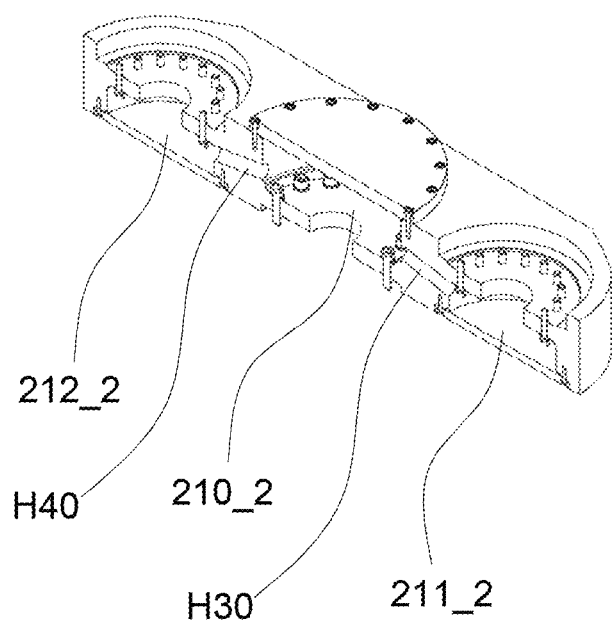

Further, by referring to FIG. 3C, the wiring holes for introducing the wirings that are inserted through the hollow of the support shaft 101 of the lower support 100 into the first transfer arm part 300 and the second transfer arm part 400 may also be formed inside the transfer arm platform 200.

That is, within the body of the transfer arm platform 200, a first wiring hole H30, bridging the first upper space 210_1 and the second lower space 211_2, and a second wiring hole H40, bridging the first upper space 210_1 and the third lower space 212_2, may be formed so that the inside of the transfer arm platform 200 is sealed without using additional sealing members.

Next, a (1_1)-st transfer link arm 310 of the first transfer arm part 300 may be engaged with the transfer arm platform 200 at the second coupling hole 220 of the transfer arm platform 200. Also, a (2_1)-st transfer link arm 410 of the second transfer arm part 400 may be engaged with the transfer arm part platform 200 at the third coupling hole 230 of the transfer arm platform 200.

Figure 4:
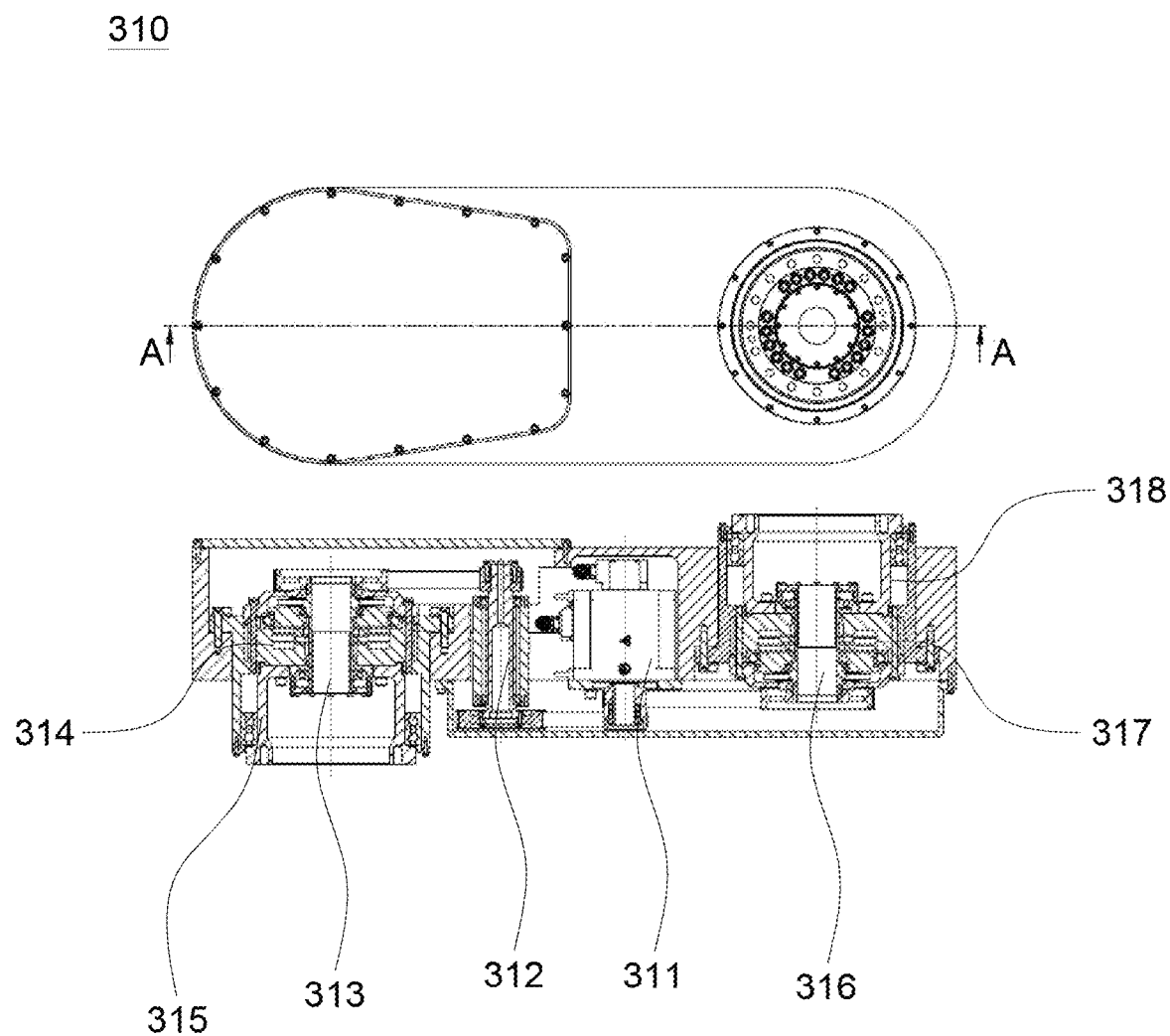
FIG. 4 is a drawing schematically illustrating a (1_1)-st transfer link arm of the substrate transfer robot in accordance with one example embodiment of the present disclosure.

Herein, by referring to FIG. 4, the (1_1)-st transfer link arm 310 of the first transfer arm part 300 may have a sealed inner space, and a first transfer driving motor 311 and a first speed reducer 312, interlocked with the first transfer driving motor 311 to reduce a rotational speed of the first transfer driving motor 311 by half, may be installed in the sealed inner space of the (1_1)-st transfer link arm 310.

Also, a (1_1)-st drive shaft 313, having a hollow formed therein and interlocked with the first speed reducer 312, and a (1_1)-st output shaft 314 interlocked with the (1_1)-st drive shaft 313 may be sealingly installed on a (1_1)-st one-end area of the (1_1)-st transfer link arm 310. Further, a (1_2)-nd drive shaft 316, having a hollow formed therein and interlocked with the first transfer driving motor 311, and a (1_2)-nd output shaft 317 interlocked with the (1_2)-nd drive shaft 316 may be sealingly installed on a (1_1)-st opposite-end area of the (1_1)-st transfer link arm 310. Herein, the interlocking between the first transfer driving motor 311 and the first speed reducer 312, the interlocking between the first speed reducer 312 and the (1_1)-st drive shaft 313 and the interlocking between the first transfer driving motor 311 and the (1_2)-nd drive shaft 316 may be respectively achieved by using a pulley method, but the present disclosure is not limited thereto, and various methods, such as a gear method, etc., may be used for transmitting rotational force. Also, the (1_1)-st drive shaft 313 and the (1_1)-st output shaft 314, and the (1_2)-nd drive shaft 316 and the (1_2)-nd output shaft 317 may each be formed with a speed reducer having a same speed reduction ratio with each other. Adding to this, the (1_1)-st output shaft 314 and the (1_2)-nd output shaft 317 may rotate in opposite directions from each other.

Further, the (1_1)-st output shaft 314 that is installed at the (1_1)-st one-end area of the (1_1)-st transfer link arm 310 of the first transfer arm part 300 may be inserted into the second upper space 211_1 of the second coupling hole 220 of the transfer arm platform 200 so as to be fixedly engaged with the second locking member 211_3.

Herein, a first linking member 315 may be used for coupling the (1_1)-st output shaft 314 and the second locking member 211_3, wherein the first linking member 315 may be a tube-shaped shaft having its length extended by a distance between the first output shaft 314 and the second locking member 211_3 at a location where the transfer arm platform 200 and the (1_1)-st transfer link arm 310 are coupled, and both ends of the first linking member 315 may be fixedly coupled with the (1_1)-st output shaft 314 and the second locking member 211_3 respectively.

Also, the (1_2)-nd output shaft 317 of the (1_1)-st transfer link arm 310 of the first transfer arm part 300 may be fixedly engaged with a (1_2)-nd one-end area of a (1_2)-nd transfer link arm 320.

Figure 5:
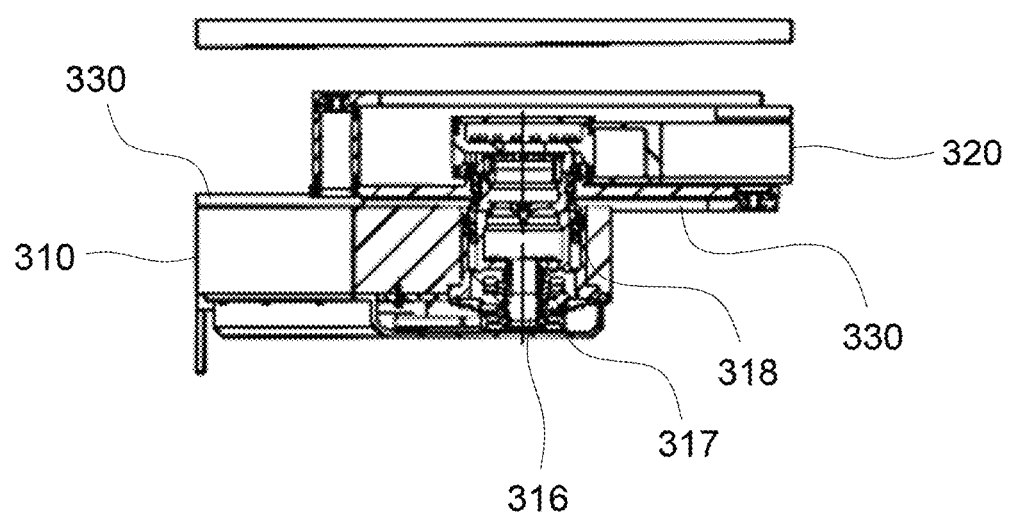
FIG. 5 is a drawing schematically illustrating a connecting part between the (1_1)-st transfer link arm and a (1_2)-nd transfer link arm of the substrate transfer robot in accordance with one example embodiment of the present disclosure.

Herein, by referring to FIG. 5, a first fixed coupling shaft 318 may be used for coupling the (1_2)-nd output shaft 317 and the (1_2)-nd one-end area, wherein the first fixed coupling shaft 318 may be a tube-shaped shaft having its length extended by a distance between the (1_2)-nd output shaft 317 and a coupling region of the (1_2)-nd one-end area to be connected to the (1_2)-nd output shaft 317 at a location where the (1_1)-st transfer link arm 310 and the (1_2)-nd transfer link arm 320 are coupled, and both ends of the first fixed coupling shaft 318 may be fixedly coupled with the (1_2)-nd output shaft 317 and the coupling region of the (1_2)-nd one-end area respectively.

In addition, a first common link arm 330 may be installed at a location where the (1_2)-nd output shaft 317 and the (1_2)-nd one-end area are coupled.

That is, a second center area of the first common link arm 330 may be rotatably engaged with the first fixed coupling shaft 318 that couples the (1_2)-nd output shaft 317 and the (1_2)-nd one-end area.

Also, the first transfer arm part 300 may include a (1_1)-st subordinate link arm 340 that is in parallel with the (1_1)-st transfer link arm 310, wherein a (1_4)-th one-end area of the (1_1)-st subordinate link arm 340 may be rotatably engaged with the first blade 291 of the link connecting member 290 of the transfer arm platform 200, and a (1_4)-th opposite-end area of the (1_1)-st subordinate link arm 340 may be rotatably engaged with a (1_3)-rd one-end area of the first common link arm 330.

Additionally, the first transfer arm part 300 may include a (1_2)-nd subordinate link arm 350 that is in parallel with the (1_2)-nd transfer link arm 320, wherein a (1_5)-th one-end area of the (1_2)-nd subordinate link arm 350 may be rotatably engaged with a (1_3)-rd opposite-end area of the first common link arm 330.

Further, the first transfer arm part 300 may include a (1_3)-rd subordinate link arm 360 that is in parallel with the first common link arm 330, wherein a (1_6)-th one-end area of the (1_3)-rd subordinate link arm 360 may be rotatably engaged with a (1_5)-th opposite-end area of the (1_2)-nd subordinate link 350, and a (1_6)-th opposite-end area of the (1_3)-rd subordinate link arm 360 may be rotatably engaged with a (1_2)-nd opposite-end area of the (1_2)-nd transfer link arm 320.

Also, the first transfer arm part 300 may include the first end effector 500, and the first end effector 500 may be fixed to the (1_6)-th opposite-end area of the (1_3)-rd subordinate link arm 360 to thereby support the substrate.

The first transfer arm part 300 configured as above may make the first end effector 500 move forward and backward along a straight line by each of the transfer arms and the subordinate arms according to an operation of the first transfer driving motor 311. Accordingly, the substrate may be loaded or unloaded at a position set by the first end effector 500.

Meanwhile, the second transfer arm part 400 may be configured similarly as the first transfer arm part 300, and the first transfer arm part 300 and the second transfer arm part 400 may be installed on the transfer arm platform 200 so as to be symmetrical to each other with respect to a central region of the transfer arm platform 200.

That is, the (2_1)-st transfer link arm 410 of the second transfer arm part 400 may have a sealed inner space, and a second transfer driving motor and a second speed reducer, interlocked with the second transfer driving motor to reduce a rotational speed of the second transfer driving motor by half, may be installed in the sealed inner space of the (2_1)-st transfer link arm 410.

Also, a (2_1)-st drive shaft, having a hollow formed therein and interlocked with the second speed reducer, and a (2_1)-st output shaft interlocked with the (2_1)-st drive shaft may be sealingly installed on a (2_1)-st one-end area of the (2_1)-st transfer link arm 410. Further, a (2_2)-nd drive shaft, having a hollow formed therein and interlocked with the second transfer driving motor, and a (2_2)-nd output shaft interlocked with the (2_2)-nd drive shaft may be sealingly installed on a (2_1)-st opposite-end area of the (2_1)-st transfer link arm 410. Herein, the interlocking between the second transfer driving motor and the second speed reducer, the interlocking between the second speed reducer and the (2_1)-st drive shaft and the interlocking between the second transfer driving motor and the (2_2)-nd drive shaft may be respectively achieved by using the pulley method, but the present disclosure is not limited thereto, and various methods, such as the gear method, etc., may be used for transmitting rotational force. Also, the (2_1)-st drive shaft and the (2_1)-st output shaft, and the (2_2)-nd drive shaft and the (2_2)-nd output shaft may each be formed with a speed reducer having a same speed reduction ratio with each other. Adding to this, the (2_1)-st output shaft and the (2_2)-nd output shaft may rotate in opposite directions from each other.

Further, the (2_1)-st output shaft that is installed at the (2_1)-st one-end area of the (2_1)-st transfer link arm 410 of the second transfer arm part 400 may be inserted into the third upper space 212_1 of the third coupling hole 230 of the transfer arm platform 200 so as to be fixedly engaged with the third locking member 212_3.

Herein, a second linking member may be used for coupling the (2_1)-st output shaft and the third locking member 212_3, wherein the second linking member may be a tube-shaped shaft having its length extended by a distance between the (2_1)-st output shaft and the third locking member 212_3 at a location where the transfer arm platform 200 and the (2_1)-st transfer link arm 410 are coupled, and both ends of the second linking member may be fixedly coupled with the (2_1)-st output shaft and the third locking member 212_3 respectively.

Also, the (2_2)-nd output shaft of the (2_1)-st transfer link arm 410 of the second transfer arm part 400 may be fixedly engaged with a (2_2)-nd one-end area of a (2_2)-nd transfer link arm 420.

Herein, a second fixed coupling shaft may be used for coupling the (2_2)-nd output shaft and the (2_2)-nd one-end area, wherein the second fixed coupling part may be a tube-shaped shaft having its length extended by a distance between the (2_2)-nd output shaft and a coupling region of the (2_2)-nd one-end area to be connected to the (2_2)-nd output shaft at a location where the (2_1)-st transfer link arm 410 and the (2_2)-nd transfer link arm 420 are coupled, and both ends of the second fixed coupling shaft may be fixedly coupled with the (2_2)-nd output shaft and the coupling region of the (2_2)-nd one-end area respectively.

In addition, a second common link arm 430 may be installed at a location where the (2_2)-nd output shaft and the (2_2)-nd one-end area are coupled.

That is, a third center area of the second common link arm 430 may be rotatably engaged with the second fixed coupling shaft that couples the (2_2)-nd output shaft and the (2_2)-nd one-end area.

Also, the second transfer arm part 400 may include a (2_1)-st subordinate link arm 440 that is in parallel with the (2_1)-st transfer link arm 410, wherein a (2_4)-th one-end area of the (2_1)-st subordinate link arm 440 may be rotatably engaged with the second blade 292 of the link connecting member 290 of the transfer arm platform 200, and a (2_4)-th opposite-end area of the (2_1)-st subordinate link arm 440 may be rotatably engaged with a (2_3)-rd one-end area of the second common link arm 430.

Additionally, the second transfer arm part 400 may include a (2_2)-nd subordinate link arm 450 that is in parallel with the (2_2)-nd transfer link arm 420, wherein a (2_5)-th one-end area of the (2_2)-nd subordinate link arm 450 may be rotatably engaged with a (2_3)-rd opposite-end area of the second common link arm 430.

Further, the second transfer arm part 400 may include a (2_3)-rd subordinate link arm 460 that is in parallel with the second common link arm 430, wherein a (2_6)-th one-end area of the (2_3)-rd subordinate link arm 460 may be rotatably engaged with a (2_5)-th opposite-end area of the (2_2)-nd subordinate link arm 450, and a (2_6)-th opposite-end area of the (2_3)-rd subordinate link arm 460 may be rotatably engaged with a (2_2)-nd opposite-end area of the (2_2)-nd transfer link arm 420.

Also, the second transfer arm part 400 may include the second end effector 600, and the second end effector 600 may be fixed to the (2_6)-th opposite-end area of the (2_3)-rd subordinate link arm 460 to thereby support the substrate.

The second transfer arm part 400 configured as above may make the second end effector 600 move forward and backward along a straight line by each of the transfer arms and the subordinate arms according to an operation of the second transfer driving motor. Accordingly, the substrate may be loaded or unloaded at a position set by the second end effector 600.

Herein, the (1_1)-st opposite-end area of the (1_1)-st transfer link arm 310 of the first transfer arm part 300 and the (2_1)-st opposite-end area of the (2_1)-st transfer link arm 410 of the second transfer arm part 400 may be identically located at the front area or a rear area of the transfer arm platform 200.

Also, unlike this, the (1_1)-st opposite-end area of the (1_1)-st transfer link arm 310 of the first transfer arm part 300 may be located at the front area of the transfer arm platform 200, while the (2_1)-st opposite-end area of the (2_1)-st transfer link arm 410 of the second transfer arm part 400 may be located at the rear area of the transfer arm platform 200.

In addition, a height of the second fixed coupling shaft, coupling the (2_1)-st transfer link arm 410 of the second transfer arm part 400 and the (2_2)-nd transfer link arm 420 of the second transfer arm part 400, may be set as higher than a height of the first fixed coupling shaft 318, coupling the (1_1)-st transfer link arm 310 of the first transfer arm part 300 and the (1_2)-nd transfer link arm 320 of the first transfer arm part 300, such that the first end effector 500 of the first transfer arm part 300 and the second end effector 600 of the second transfer arm part 400 may be positioned at different heights during operations of the first end effector 500 and the second end effector 600.

Further, the second common link arm 430 that couples the (2_1)-st transfer link arm 410 of the second transfer arm part 400 and the (2_2)-nd transfer link arm 420 of the second transfer arm part 400 may include a hollow tube, corresponding to the height of the second fixed coupling shaft and having a hollow formed therein for inserting the second fixed coupling shaft therein. Herein, a third blade including the (2_3)-rd one-end area may be fixedly coupled with a lower area of the hollow tube and a fourth blade including the (2_3)-rd opposite-end area may be fixedly coupled with an upper area of the hollow tube. Also, the (2_3)-rd one-end area and the (2_3)-rd opposite-end area with respect to a central axis of the hollow tube may lie symmetrically on each side of the central axis of the hollow tube when viewed from the central axis of the hollow tube.

In addition, a first wiring for an operation of the first transfer driving motor 311 and a second wiring for an operation of the second transfer driving motor may be respectively disposed in an enclosed space inside the substrate transfer robot 1000.

Herein, the first wiring may be fed into the first transfer driving motor 311 through the hollow of the support shaft 101 of the lower support 100 and the hollow of the (1_1)-st drive shaft 313 so as to prevent the first wiring from being exposed to the inner space of the vacuum chamber. Also, the second wiring may be fed into the second transfer driving motor through the hollow of the support shaft 101 of the lower support 100 and the hollow of the (2_1)-st drive shaft so as to prevent the second wiring from being exposed to the inner space of the vacuum chamber. Meanwhile, the first wiring and the second wiring may be respectively branched from the support shaft 101 into the first transfer arm part 300 and the second transfer arm part 400 through a wiring hole formed at the transfer arm platform 200.

Although the transfer of the substrate has been described above, the present disclosure may also be applied to a transfer of masks necessary for processing the substrates.

The present disclosure has an effect of providing a compact substrate transfer robot by integrating a drive system for transferring the substrate within a link arm.

The present disclosure has another effect of reducing time required for repair and maintenance of the substrate transfer robot by enabling repair and maintenance of the drive system to be all carried out at the link arm in which all the drive system is located.

The present disclosure has still another effect of preventing any generation of particles by having a sealed structure that is completely sealed away within the vacuum chamber.

As seen above, the present disclosure has been explained by specific matters such as detailed components, limited embodiments, and drawings. While the invention has been shown and described with respect to the preferred embodiments, it, however, will be understood by those skilled in the art that various changes and modification may be made without departing from the spirit and scope of the invention as defined in the following claims.

Accordingly, the thought of the present disclosure must not be confined to the explained embodiments, and the following patent claims as well as everything including variations equal or equivalent to the patent claims pertain to the category of the thought of the present disclosure.

What is claimed is:

1. A substrate transfer robot for transferring a substrate in a vacuum chamber, comprising:

a transfer arm platform through which a first coupling hole, a second coupling hole and a third coupling hole are formed respectively at a first center area, a first one-end area and a first opposite-end area thereof, wherein a first locking member, through which a first through-hole corresponding to a hollow of a support shaft formed on a transfer robot coupling part of a lower support, compartmentalizes the first coupling hole into a first upper space sealed by a first cover and a first lower space, wherein a second locking member, through which a second through-hole is formed, compartmentalizes the second coupling hole into a second upper space and a second lower space sealed by a second cover, wherein a third locking member, through which a third through-hole is formed, compartmentalizes the third coupling hole into a third upper space and a third lower space sealed by a third cover, wherein a link connecting member including a first blade and a second blade for link connection is fixedly engaged at a front area, with a direction of the front area being a direction of a processing chamber from the substrate transfer robot when the substrate transfer robot is positioned to transfer the substrate to the processing chamber coupled with the vacuum chamber, and wherein the support shaft at the lower support inserted into the first lower space is fixedly engaged with the first locking member;

a first transfer arm part including a (1_1)-st transfer link arm, a (1_2)-nd transfer link arm, a first common link arm, a (1_1)-st subordinate link arm parallel to the (1_1)-st transfer link arm, a (1_2)-nd subordinate link arm parallel to the (1_2)-nd transfer link arm, a (1_3)-rd subordinate link arm parallel to the first common link arm, and a first end effector, wherein a first transfer driving motor and a first speed reducer, interlocked with the first transfer driving motor to reduce a rotational speed of the first transfer driving motor by half, are installed in a sealed inner space of the (1_1)-st transfer link arm, wherein a (1_1)-st drive shaft, having a hollow formed therein and interlocked with the first speed reducer, and a (1_1)-st output shaft interlocked with the (1_1)-st drive shaft are sealingly installed on a (1_1)-st one-end area of the (1_1)-st transfer link arm, wherein a (1_2)-nd drive shaft, having a hollow formed therein and interlocked with the first transfer driving motor, and a (1_2)-nd output shaft interlocked with the (1_2)-nd drive shaft are sealingly installed on a (1_1)-st opposite-end area of the (1_1)-st transfer link arm, wherein the (1_1)-st output shaft of the (1_1)-st transfer link arm is fixedly engaged with a first linking member that is inserted into the second upper space of the transfer arm platform to be fixedly engaged with the second locking member, wherein a (1_2)-nd one-end area of the (1_2)-nd transfer link arm is fixedly engaged with the (1-2)-nd output shaft of the (1_1)-st transfer link arm through a first fixed coupling shaft, wherein a second center area of the first common link arm is rotatably engaged with the first fixed coupling shaft, wherein a (1_4)-th one-end area of the (1_1)-st subordinate link arm is rotatably engaged with the first blade of the link connecting member of the transfer arm platform, and a (1_4)-th opposite-end area of the (1_1)-st subordinate link arm is rotatably engaged with a (1_3)-rd one-end area of the first common link arm, wherein a (1_5)-th one-end area of the (1_2)-nd subordinate link arm is rotatably engaged with a (1_3)-rd opposite-end area of the first common link arm, wherein a (1_6)-th one-end area of the (1_3)-rd subordinate link arm is rotatably engaged with a (1_5)-th opposite-end area of the (1_2)-nd subordinate link arm, and a (1_6)-th opposite-end area of the (1_3)-rd subordinate link arm is rotatably engaged with a (1_2)-nd opposite-end area of the (1_2)-nd transfer link arm, and wherein the first end effector is fixed to the (1_6)-th opposite-end area of the (1_3)-rd subordinate link arm to thereby support the substrate; and a second transfer arm part including a (2_1)-st transfer link arm, a (2_2)-nd transfer link arm, a second common link arm, a (2_1)-st subordinate link arm parallel to the (2_1)-st transfer link arm, a (2_2)-nd subordinate link arm parallel to the (2_2)-nd transfer link arm, a (2_3)-rd subordinate link arm parallel to the second common link arm, and a second end effector, wherein a second transfer driving motor and a second speed reducer, interlocked with the second transfer driving motor to reduce a rotational speed of the second transfer driving motor by half, are installed in a sealed inner space of the (2_1)-st transfer link arm, wherein a (2_1)-st drive shaft, having a hollow formed therein and interlocked with the second speed reducer, and a (2_1)-st output shaft interlocked with the (2_1)-st drive shaft are sealingly installed on a (2_1)-st one-end area of the (2_1)-st transfer link arm, wherein a (2_2)-nd drive shaft, having a hollow formed therein and interlocked with the second transfer driving motor, and a (2_2)-nd output shaft interlocked with the (2_2)-nd drive shaft are sealingly installed on a (2_1)-st opposite-end area of the (2_1)-st transfer link arm, wherein the (2_1)-st output shaft of the (2_1)-st transfer link arm is fixedly engaged with a second linking member that is inserted into the third upper space of the transfer arm platform to be fixedly engaged with the third locking member, wherein a (2_2)-nd one-end area of the (2_2)-nd transfer link arm is fixedly engaged with the (2-2)-nd output shaft of the (2_1)-st transfer link arm through a second fixed coupling shaft, wherein a third center area of the second common link arm is rotatably engaged with the second fixed coupling shaft, wherein a (2_4)-th one-end area of the (2_1)-st subordinate link arm is rotatably engaged with the second blade of the link connecting member of the transfer arm platform, and a (2_4)-th opposite-end area of the (2_1)-st subordinate link arm is rotatably engaged with a (2_3)-rd one-end area of the second common link arm, wherein a (2_5)-th one-end area of the (2_2)-nd subordinate link arm is rotatably engaged with a (2_3)-rd opposite-end area of the second common link arm, wherein a (2_6)-th one-end area of the (2_3)-rd subordinate link arm is rotatably engaged with a (2_5)-th opposite-end area of the (2_2)-nd subordinate link arm, and a (2_6)-th opposite-end area of the (2_3)-rd subordinate link arm is rotatably engaged with a (2_2)-nd opposite-end area of the (2_2)-nd transfer link arm, and wherein the second end effector is fixed to the (2_6)-th opposite-end area of the (2_3)-rd subordinate link arm to thereby support the substrate, wherein the lower support comprises an elevating part with an elevating drive shaft that is coaxial with the support shaft at the lower support;

wherein a first coupling hole axis is coaxial with an elevating drive shaft axis.

2. The substrate transfer robot of claim 1, wherein the (1_1)-st opposite-end area of the (1_1)-st transfer link arm of the first transfer arm part is located at the front area of the transfer arm platform, and the (2_1)-st opposite-end area of the (2_1)-st transfer link arm of the second transfer arm part is located at a rear area of the transfer arm platform.

3. The substrate transfer robot of claim 1, wherein a height of the second fixed coupling shaft is set as higher than a height of the first fixed coupling shaft such that the first end effector and the second end effector are positioned at different heights during operations of the first end effector and the second end effector.

4. The substrate transfer robot of claim 1, wherein the second common link arm includes a hollow tube corresponding to a height of the second fixed coupling shaft and having a hollow formed therein for inserting the second fixed coupling shaft therein, wherein a third blade including the (2_3)-rd one-end area is fixedly coupled with a lower area of the hollow tube and a fourth blade including the (2_3)-rd opposite-end area is fixedly coupled with an upper area of the hollow tube, and wherein the (2_3)-rd one-end area and the (2_3)-rd opposite-end area with respect to a central axis of the hollow tube are lying symmetrically on each side of the central axis of the hollow tube when viewed from the central axis of the hollow tube.

5. The substrate transfer robot of claim 1, wherein the transfer arm platform further includes: a first wiring hole bridging the first upper space and the second lower space; and a second wiring hole bridging the first upper space and the third lower space.

6. The substrate transfer robot of claim 1, wherein the transfer arm platform further includes: a (1_1)-st wiring hole and a (1_2)-nd wiring hole, each bridging the first upper space and one side of a body of the transfer arm platform; a (2_1)-st wiring hole, bridging the second lower space and the one side of the body of the transfer arm platform; a (2_2)-nd wiring hole, bridging the third lower space and the one side of the body of the transfer arm platform; a first sealing cover, sealing the (1_1)-st wiring hole and the (2_1)-st wiring hole at the one side of the body of the transfer arm platform; and a second sealing cover, sealing the (1_2)-nd wiring hole and the (2_2)-nd wiring hole at the one side of the body of the transfer arm platform.

7. The substrate transfer robot of claim 1, wherein the substrate transfer robot further includes: a first wiring for an operation of the first transfer driving motor; and a second wiring for an operation of the second transfer driving motor,
  wherein the first wiring is fed into the first transfer driving motor through the hollow of the support shaft and the hollow of the (1_1)-st drive shaft so as to prevent the first wiring from being exposed to an inner space of the vacuum chamber, and
  wherein the second wiring is fed into the second transfer driving motor through the hollow of the support shaft and the hollow of the (2_1)-st drive shaft so as to prevent the second wiring from being exposed to the inner space of the vacuum chamber.

* * * * *